(12) United States Patent
Twu et al.

(10) Patent No.: US 6,405,452 B1
(45) Date of Patent: Jun. 18, 2002

(54) METHOD AND APPARATUS FOR DRYING WAFERS AFTER WET BENCH

(75) Inventors: Jih-Churng Twu, Chung-Ho; Ming-Dar Guo, Tainan; Yu-Chien Hsiao, Peitou; Chia-Chun Cheng, Tainan, all of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/820,119

(22) Filed: Mar. 28, 2001

(51) Int. Cl.[7] .................................................. F26B 21/14
(52) U.S. Cl. ............................... 34/467; 34/72; 34/443; 34/428; 134/61; 134/902; 134/104.1
(58) Field of Search ......................... 34/329, 427, 428, 34/443, 447, 451, 72, 189, 467; 134/61, 902, 104.1

(56) References Cited

U.S. PATENT DOCUMENTS

| | | | |
|---|---|---|---|
| 5,657,553 A | * | 8/1997 | Tarui et al. ...................... 34/78 |
| 5,807,439 A | * | 9/1998 | Akatsu et al. .................. 134/32 |
| 5,902,402 A | * | 5/1999 | Durst et al. ................... 118/423 |
| 6,128,830 A | * | 10/2000 | Bettcher et al. ............... 34/404 |
| 6,216,364 B1 | * | 4/2001 | Tanaka et al. ................. 34/448 |
| 6,219,936 B1 | * | 4/2001 | Kedo et al. .................... 34/381 |
| 2001/0020482 A1 | * | 9/2001 | Scranton et al. .............. 134/61 |

* cited by examiner

Primary Examiner—Ira S. Lararus
Assistant Examiner—K. B. Rinehart
(74) Attorney, Agent, or Firm—Tung & Associates

(57) ABSTRACT

A method for drying wafers after a wet bench process is disclosed. In the method, a wafer is first immersed in a volume of DI water held in a container. A mixture of alcohol vapor/inert gas is then flown into the upper portion of the container that is not filled with the volume of DI water at a flow rate of less than 20 l/min. The wafer is then withdrawn from the DI water into the upper portion of the container filled with the alcohol vapor/inert gas mixture and thereby driving DI water molecules off the surface of the wafer without leaving organic residue on the wafer surface.

15 Claims, 1 Drawing Sheet

METHOD AND APPARATUS FOR DRYING WAFERS AFTER WET BENCH

FIELD OF THE INVENTION

The present invention generally relates to a method and an apparatus for drying wafers after a wet bench process and more particularly, relates to a method and an apparatus for drying wafers by alcohol vapor after a wet bench process is conducted by incorporating a DI water rinse step, an inert gas blown dry step and a step of reducing the alcohol vapor flow rate into the drying tank.

BACKGROUND OF THE INVENTION

In the fabrication of semiconductor devices, a large quantity of deionized (DI) water is frequently used to clean wafers in a wet bench process. For instance, when residual chemical must be removed from the surface of a wafer, DI water rinse is used in the wet bench process to perform major wafer cleaning operations such as quick-dump-rinse and cascade overflow rinse. It is desirable that the surface of the wafer be cleaned by DI water after a chemical or polishing process has been conducted on the wafer, i.e. oxide or nitride deposition, etching or chemical mechanical polishing process. The wet bench wafer cleaning step can be accomplished by equipment that is installed either in-line or in a batch-type process.

A typical automated wafer scrubber combines brush and solution scrubbing by DI water. The scrubber utilizes a hyperbolic high-pressure spray of DI water with a retractable cleaning brush. A typical wafer scrubbing process consists of a DI water spray step followed by a spin dry and nitrogen gas blow dry step. More recently, the solvent drying technology such as the use of isopropyl alcohol (IPA) has been developed to further improve the drying technology.

In a solvent drying technology, such as one that utilizes IPA shown in FIG. 1, the drying process is conducted in a static manner or with the wafer positioned statically without movement. The wafer drying 10 is constructed of a drying tank 12 constructed with a wafer receptacle 14, a chiller 16, a sidewall heater 18 and a bottom heater 20. A cleaned and wet wafer is transported into the drying tank 12, or the vapor chamber. A vapor of IPA is transported into the chamber cavity 22 by a carrier gas such as a high purity nitrogen, or any other high purity inert gas. The vapor enters into cavity 22 is then heated by the bottom heater 20 such that IPA is further vaporized and rises into the cavity 22. The wafer 24 is surrounded by the IPA vapor and, due to the high volatility of IPA, water on the wafer surface can be evaporated away without leaving any water mark, contaminating particles or metal particles. The vapor pressure of IPA can be suitably adjusted such that there is a steady flow of IPA vapor in the cavity 22 fed from the IPA reservoir tank 26.

In the conventional IPA drying tank 10 shown in FIG. 1, the only moving part for transferring wafers into and out of the chamber cavity is a robot arm. There are no other moving parts which can produce contaminating particles. The IPA drying chamber can thus be kept in an extremely clean condition to avoid any contamination of the wafer surface. To further maintain the cleanliness of the chamber cavity 22, an air filter 28 is utilized for filtering incoming air into the cavity 22 and for providing a suitable flow rate of the IPA vapor. After the cleaning process is completed, the water-containing IPA vapor is condensed by the chiller 16 into IPA liquid and is collected at the bottom of the drying chamber 12 for recycling and reuse by the process. The IPA vapor drying process is normally controlled by three major elements, i.e. the purity and the water content of IPA; the flow rate and flow speed of the IPA vapor; and the cleanliness of the IPA vapor.

An improved solvent drying technique has been proposed in recent years which is similar in principal to that described above. In a Maragoni dryer, the drying principal is based on the different surface tensions of IPA and DI water. The different surface tensions cause the ejection of water molecules from the wafer surface which are then collected by a reservoir in the drying apparatus. The Maragoni drying process is carried out by slowly withdrawing a wafer from a DI water tank immersed in DI water. At the same time, IPA vapor carried by $N_2$ carrier gas is flown onto the wet wafer surface such that IPA is saturated on the exposed wafer surface above the water level. Since the concentration of IPA on the surface of the exposed wafer is larger than the concentration of DI water, the surface tension of IPA is smaller than the surface tension of water in the water tank. This causes the water molecules on the surface of the exposed wafer to be retracted into the water tank and thus achieving the drying purpose.

In the Maragoni drying process, the alcohol vapor frequently cause other processing difficulties. For instance, when residual alcohol is left in the drying tank by depositing on the tank walls, alcohol becomes a source of contamination for the bare silicon surface and causes silicon hole defects. Since alcohol is a necessary element in the Maragoni drying process, it is difficult to completely eliminate residual alcohol on the chamber walls after each batch of wafers is cleaned.

TABLE I

| | | | Defect Count | | |
|---|---|---|---|---|---|
| Test No. | Condition | POD | Slot 1 | Slot 24 | Slot 25 |
| 1 | All DIW bath (DIW filling) + no MG/D | 1 | 5 | 7 | 6 |
| 2 | Empty DIW bath (no water) + MG/D 2 times | 1 | 162 | 11 | 91 |
| 3 | Empty DIW bath (no water) + MG/D 1 time | 1 | 62 | 11 | 161 |
| 4 | Empty DIW bath (no water) + no MG/D | 1 | 13 | 9 | 18 |

In a normal Maragoni drying process, it has been discovered that the wafer positioned in slot 25 suffers the most severe effect caused by any contaminating conditions in the process. As shown in Table I, Test No. 1 was conducted with the bath filled with DI water, however, no Maragoni drying process was conducted, i.e. the wafers were not exposed to alcohol vapor. It was shown that the defect count is very low on wafers selected from the three different slots of 1, 24 and 25. When the Maragoni drying process was conducted two times, as in Test No. 2, where the bath was empty with no water, the defect counts increases drastically from 6 to 91. A similar Maragoni drying test was conducted in Test No. 3 wherein the Maragoni drying process was carried out only once, the defect count is still very high when compared to data in Test No. 1. Test No. 4 was conducted under conditions similar to that used in Test No. 1, i.e. with no Maragoni drying process being conducted. It is seen that the defect count is very low due to the lack of exposure of the bare wafer surfaces to alcohol, or to the organic vapor of alcohol.

The data shown in Table I suggests that the residual alcohol, or the organic residue after a Maragoni drying process, is the major cause of the high defect count on the wafers. The defects are frequently shown as silicon holes on the bare silicon surface. When the defect count is higher than about 75, the entire wafer is considered as unacceptable for quality reasons. When the defect count is much higher than 75, the wafer may be scrapped. Ideally, the defect count on the bare silicon wafer should be less than 40 for the wafer to pass quality control tests.

It is therefore an object of the present invention to provide a method for drying wafers after wet bench that does not have the drawbacks or shortcomings of the conventional Maragoni drying process.

It is another object of the present invention to provide a method for drying wafers after wet bench that minimizes the amount of organic residue left in the drying apparatus.

It is a further object of the present invention to provide a method for drying wafers after wet bench by reducing the flow rate of alcohol vapor into the drying tank.

It is another further object of the present invention to provide a method for drying wafers after wet bench by reducing the flow rate of alcohol vapor into the drying tank to less than 20 liter/min.

It is still another object of the present invention to provide a method for drying wafers after wet bench by providing an additional fluid conduit into the drying tank for flowing a deionized water stream into the tank and rinsing the tank wall.

It is yet another object of the present invention to provide a method for drying wafers after wet bench by providing fluid conduits into the drying tank for flowing an inert gas into the tank and drying the tank wall after rinsed by DI water.

It is still another further object of the present invention to provide an apparatus for drying wafers after wet bench in an alcohol vapor wherein the apparatus is further equipped with fluid conduits for DI water for rinsing the tank wall and removing organic residues.

It is yet another further object of the present invention to provide an apparatus for drying wafers after wet bench in an alcohol vapor by further providing fluid conduits into the drying tank for flowing an inert gas and drying the tank wall after a rinsing-process for removing the organic residue.

SUMMARY OF THE INVENTION

In accordance with the present invention, a method and an apparatus for drying wafers after wet bench without the organic residue problem are provided.

In a preferred embodiment, a method for drying wafers after wet bench can be carried out by the operating steps of first immersing a wafer in a container filled with a volume of deionized water; flowing a mixture of alcohol vapor and inert gas into an upper portion of the container not filled with the volume of deionized water at a flow rate not higher than 20 l/min; and withdrawing the wafer from the deionized water into the upper portion of the container that is filled with the alcohol vapor/inert gas mixture and thereby driving water molecules off the surface of the wafer.

The method for drying wafers after wet bench may further include the step of forming a mixture of alcohol vapor and inert gas from isopropyl alcohol and nitrogen, or the step of flowing the mixture of alcohol vapor and inert gas at a flow rate not higher than 10 l/min; or the step of flowing the mixture of alcohol vapor and inert gas at a flow rate preferably not higher than 6 l/min. The method for drying wafers after wet bench may further include the steps of providing a separate inlet for an inert gas in a sidewall of the container; and flowing an inert gas into the upper portion of the container to further dilute the alcohol vapor/inert gas mixture. The method may further include the step of providing a separate inlet at a location juxtaposed to an alcohol vapor/inert gas mixture inlet through the sidewall of the container. The method may further include the step of flowing the inert gas into the upper portion of the container at a flow rate of at least 5 l/min.

The present invention is further directed to a method for drying wafers after a wet bench process which can be carried out by the operating steps of first filling a container with a volume of deionized water; flowing a mixture of alcohol vapor and inert gas into an upper portion of the container not filled with the volume of deionized water at a flow rate not higher than 20 l/min; flowing a volume of an inert gas into the upper portion of the container at a flow rate of at least 5 l/min; and withdrawing the wafer from the deionized water into the upper portion of the container that is filled with the alcohol vapor/inert gas mixture and thereby driving deionized water molecules off the surface of the wafer.

The method for drying wafers after a wet bench process may further include the step of mounting an inert gas inlet in a sidewall of the container juxtaposed to an inlet for the alcohol vapor/inert gas mixture. The alcohol vapor/inert gas mixture may be formed of isopropyl alcohol vapor and nitrogen. The inert gas may be nitrogen. The method may further include the step of flowing the mixture of alcohol vapor and inert gas at a flow rate not higher than 10 l/min; or at a flow rate preferably not higher than 6 l/min.

The present invention is further directed to an apparatus for drying wafers after wet bench in an alcohol vapor which includes an inner tank formed by four sidewalls and a bottom wall for holding a volume of deionized water therein; a wafer holder for carrying at least one wafer therein and for moving into and out of the volume of deionized water; an outer tank surrounding the inner tank for receiving an overflow from the inner tank; at least one deionized water inlet through a sidewall of the outer tank for flowing deionized water onto and rinsing the sidewalls of the inner tank to remove residual alcohol on at least one of the sidewalls; at least one inert gas inlet through the sidewall of the outer tank for flowing an inert gas onto and drying the at least one of the sidewalls of the inner tank; and an alcohol vapor dispensing means for dispensing an alcohol vapor onto the at least one wafer.

The apparatus for drying wafers after wet bench in an alcohol vapor may further include elevator means for lowering/raising the wafer holder into/out of the volume of deionized water. The at least one deionized water inlet through a sidewall of the outer tank may include four deionized water inlets each for dispensing deionized water onto one sidewall of the inner tank. The at least one inert gas inlet through a sidewall of the outer tank may include four inert gas inlets each for drying one sidewall of the inner tank. The alcohol vapor dispensing means may be an isopropyl alcohol vapor dispensing means.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
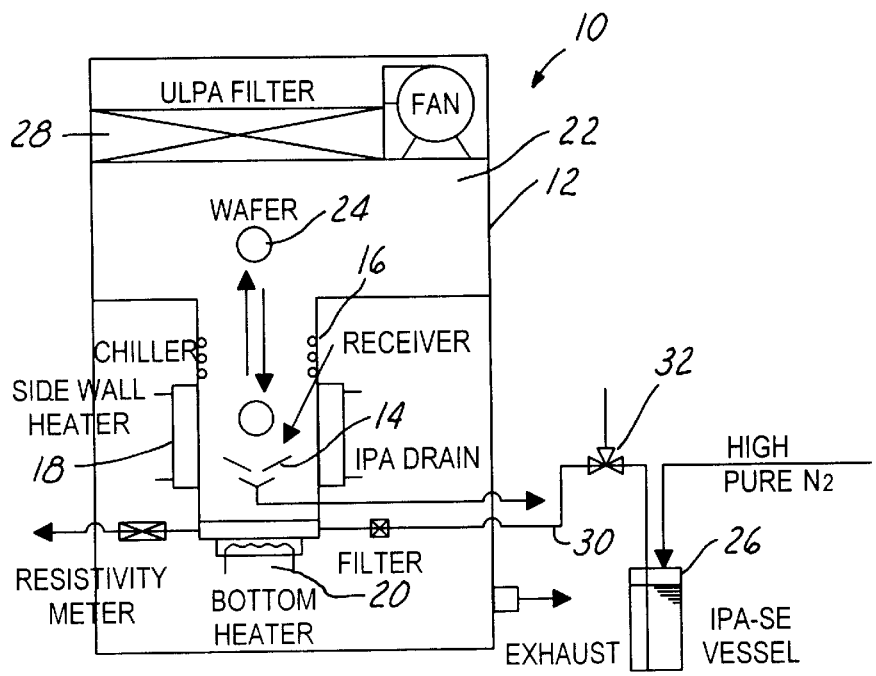
FIG. 1 is a cross-sectional view of a conventional solvent drying apparatus for drying wafers.

The present invention discloses a method for drying wafers after a wet bench process is conducted which can be carried out by first immersing at least one wafer in a volume of deionized water contained in a container; then flowing a mixture of alcohol vapor and inert gas into an upper portion of the container that is not filled with the volume of deionized water, the flow of the alcohol vapor/inert gas mixture is conducted at a flow rate not higher than 20 l/min. The at least one wafer is then withdrawn from the deionized water into the upper portion of the container filled with the alcohol vapor/inert gas mixture and thereby driving deionized water molecules off the surface of the at least one wafer.

The present invention method for drying wafers may further include the steps of proving a separate inlet for an inert gas in a sidewall of the container, and flowing an inert gas into the upper portion of the container to further dilute the alcohol vapor/inert gas mixture. The separate inlet for the inert gas may be positioned at a location juxtaposed to the alcohol vapor/inert gas mixture inlet through the sidewall of the container. An inert gas, such as nitrogen, can then be flown into the upper portion of the container through the separate inlet at a flow rate of at least 5 l/min. The present invention method for drying wafers after a wet bench process can further be carried out by first filling a container with a volume of DI water; flowing a mixture of alcohol vapor/inert gas into an upper portion of the container that is not filled with the volume of DI water at a flow rate of not-higher than 20 l/min; flowing a volume of an inert gas into the upper portion of the container at a flow rate of at least 5 l/min; and withdrawing the wafer from the DI water into the upper portion of the container that is filled with the alcohol vapor/inert gas mixture and thereby driving DI water molecules off the surface of the wafer.

The present invention is still further directed to an apparatus that is used for drying wafers after a wet bench process is conducted on the wafers. The apparatus can be constructed by an inner tank, an outer tank, a wafer holder, at least one DI water inlet, at least one inert gas inlet, and an alcohol vapor dispensing means into the drying chamber. The inner tank can be constructed by four sidewalls and a bottom wall for holding a volume of DI water therein. The outer tank surrounds the inner tank for receiving a possible overflow from the inner tank. The wafer holder is used to carry at least one, and preferably fifty, wafers therein for moving into and out of the volume of DI water. The at least one DI water inlet is provided through a sidewall of the outer tank for flowing DI water onto and rinsing the sidewalls of the inner tank to remove organic residue, i.e. from alcohol, on the sidewalls. The at least one inert gas inlet is provided through the sidewall of the outer tank for flowing an inert gas onto and for drying the at least one sidewall of the inner tank. The alcohol vapor dispensing means is used for dispensing an alcohol vapor, such as an isopropyl alcohol vapor onto the at least one wafer.

The present invention novel method and apparatus reduces the concentration of alcohol vapor in an alcohol vapor/inert gas mixture flown into the drying chamber to prevent organic residue, i.e. alcohol residue, formation on the chamber wall. The invention may further be implemented by adding an inert gas flow through a separate inert gas conduit into the drying tank and thus diluting the alcohol vapor in the drying chamber.

The present invention may further be implemented by adding fluid conduits through the outer tank of a Maragoni dryer for flowing both a DI water and an inert gas into the drying chamber. The DI water is flown into the drying chamber for rinsing the sidewalls of an inner tank and thus eliminating any organic residues deposited thereon. The inert gas purge is utilized to dry the sidewalls after the DI water rinsing step. By providing the additional fluid conduits for the DI water and for the inert gas into the drying tank, the present invention novel method can further enhance the desirable results of the present invention of preventing organic residues in the drying chamber from contaminating bare silicon surfaces on the wafers cleaned.

Figure 2:
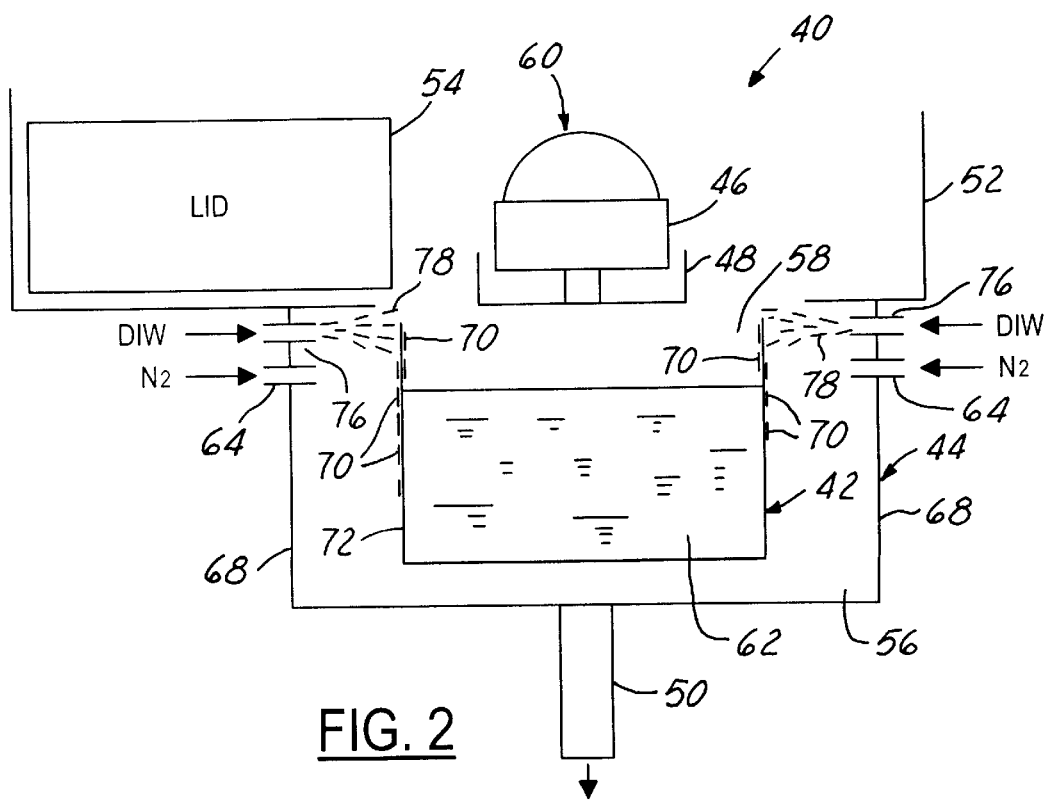
FIG. 2 is a cross-sectional view of the present invention solvent drying apparatus incorporating additional fluid inlets for flowing in deionized water for rinsing the sidewall of the drying tank, and for flowing in inert gas for drying the sidewall of the drying tank.

Referring now to FIG. 2, wherein a present invention solvent drying apparatus 40 is shown. The solvent drying apparatus is constructed by an inner tank 42, an outer tank 44, a drain conduit 50 in fluid communication with a cavity 56 in the outer tank 44, an upper chamber wall 52, and a lid 54 that slidingly engages the upper chamber wall 52. A multiplicity of wafers 60 is normally positioned by a robot (not shown) into a wafer holder 46 which is operated by an elevator means 48 for lowering into or rising out of a volume of DI water 62, as shown in FIG. 2.

The present invention novel method can be carried out by first reducing the flow rate of an alcohol vapor/inert gas mixture into the drying chamber 58 after lid 54 is closed on the upper chamber wall 52. The rate of alcohol vapor/inert gas mixture, i.e. such as an isopropyl alcohol vapor/nitrogen gas mixture, may be controlled at less than 20 l/min., and preferably at less than 10 l/min. A flow rate utilized in the preferred embodiment of the present invention novel method is about 6 l/min.

The present invention novel method may further be implemented by adding an inert gas flow into the drying chamber 58 through a separate inert gas inlet 64. The additional inert gas flow into the chamber cavity 58 may further dilute the alcohol vapor/inert gas mixture such that the generation of organic residues 70 on the chamber wall 72 of the inner tank 42 can be reduced or prevented.

In another preferred embodiment of the present invention, additional fluid conduits 76 are provided through the sidewall 68 of the outer tank 44, as shown in FIG. 2. A cleaning solvent, i.e. DI water, can be flown through the fluid conduits 76 for spraying DI water 78 onto the sidewall 72 of the inner tank 42. Any organic residue 70 accumulated on the sidewall 72 can thus be rinsed off the sidewall 72 and be drained away through drain conduit 50. After the sidewall 72 is rinsed by the DI water 78, inert gas, i.e. nitrogen, can be flown onto the sidewall 72 through fluid conduit or fluid inlet 64 for drying the sidewall 72, thus completing the inner tank sidewall cleaning process.

The effectiveness of the present invention novel method is shown in Table II below.

TABLE II

| | | | Defect Count | | |
| --- | --- | --- | --- | --- | --- |
| Test No. | Condition | POD | Slot 1 | Slot 24 | Slot 25 |
| 1 | MG/D normal run DIW only (no N$_2$, no IPA/N$_2$) | 1 | 11 | 7 | 12 |

TABLE II-continued

|  |  |  | Defect Count | | |
|---|---|---|---|---|---|
| Test No. | Condition | POD | Slot 1 | Slot 24 | Slot 25 |
| 2 | MG/D normal run (high flow) N$_2$: 40 l/min IPA/N$_2$: 40 l/min | 1 | 132 | 7 | 259 |
| 3 | MG/D normal run (low flow) N$_2$: 6 l/min, IPA/N$_2$: 6 l/min | 1 | 28 | 3 | 16 |

In Test No. 1 shown in Table II, the Maragoni drying process was conducted with only DI water, i.e. with no alcohol vapor/inert gas filling the drying chamber. It is seen that the defect count is very low, well within the acceptable limit. In Test No. 2, when the alcohol vapor/inert gas mixture is flown into the drying chamber at a flow rate of 40 l/min., a very high defect count, i.e. 259 at slot 25, is detected. By utilizing the present invention novel method, as shown in Test No. 3, where the flow rate of the alcohol vapor/inert gas mixture is reduced from 40 l/min. to 6 l/min., the defect count is reduced from 259 to 16, i.e, more than 10 fold reduction. The effectiveness of the present invention novel method of reducing alcohol vapor concentration in an alcohol vapor/inert gas mixture flown into a drying chamber is therefore clearly demonstrated.

The present invention novel method and apparatus have therefore been amply described in the above description and in the appended drawing of FIG. 2.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for drying wafers after wet bench comprising the steps of:
   immersing a wafer in a container filled with a volume of deionized water;
   flowing a mixture of alcohol vapor and inert gas into an upper portion of the container not filled with said volume of deionized water at a flow rate less than 20 l/min;
   providing a separate inlet for an inert gas in a sidewall of said container;
   flowing an inert gas into said upper portion of the container to further dilute said alcohol vapor/inert gas mixture; and
   withdrawing said wafer from said deionized water into said upper portion of the container that is filled with said alcohol vapor/inert gas mixture and thereby driving deionized water molecules off the surface of said wafer without leaving organic residue on the wafer surface.

2. A method for drying wafers after wet bench according to claim 1 further comprising the step of forming a mixture of alcohol vapor and inert gas from isopropyl alcohol and nitrogen.

3. A method for drying wafers after wet bench according to claim 1 further comprising the step of flowing said mixture of alcohol vapor and inert gas at a flow rate less than 10 l/min.

4. A method for drying wafers after wet bench according to claim 1 further comprising the step of flowing said mixture of alcohol vapor and inert gas at a flow rate less than 6 l/min.

5. A method for drying wafers after wet bench according to claim 1 further comprising the step of providing said separate inlet at a location juxtaposed to an alcohol vapor/inert gas mixture inlet through said sidewall of the container.

6. A method for drying wafers after wet bench according to claim 1 further comprising the step of flowing said inert gas into said upper portion of the container at a flow rate of at least 5 l/min.

7. A method for drying wafers after a wet bench process comprising the steps of:
   filling a container with a volume of deionized water;
   mounting an inert gas inlet in a sidewall of said container juxtaposed to an inlet for an alcohol vapor/inert gas mixture;
   flowing a mixture of alcohol vapor and inert gas into an upper portion of the container not filled with said volume of deionized water at a flow rate less than 20 l/min;
   flowing a volume of an inert gas into said upper portion of the container at a flow rate of at least 5 l/min; and
   withdrawing said wafer from said deionized water into said upper portion of the container that is filled with said alcohol vapor/inert gas mixture and thereby driving deionized water molecules off the surface of said wafer.

8. A method for drying wafers after a wet bench process according to claim 7, wherein said alcohol vapor/inert gas mixture is formed from isopropyl alcohol vapor and nitrogen.

9. A method for drying wafers after a wet bench process according to claim 7, wherein said inert gas is nitrogen.

10. A method for drying wafers after a wet bench process according to claim 7 further comprising the step of flowing said mixture of alcohol vapor and inert gas at a flow rate less than 10 l/min.

11. A method for drying wafers after a wet bench process according to claim 7 further comprising the step of flowing said mixture of alcohol vapor and inert gas at a flow rate less than 6 l/min.

12. An apparatus for drying wafers after wet bench in an alcohol vapor comprising:
   an inner tank formed by four sidewalls and a bottom wall for holding a volume of deionized water therein;
   a wafer holder for carrying at least one wafer therein and for moving into and out of said volume of deionized water;
   an outer tank surrounding said inner tank for receiving an overflow from said inner tank;
   at least one deionized water inlet through a sidewall of said outer tank for flowing deionized water onto and rinsing said sidewalls of said inner tank to remove residual alcohol on at least one of said sidewalls, said at least one deionized water inlet comprises four deionized water inlets each for dispensing deionized water onto one sidewall of said inner tank;

at least one inert gas inlet through said sidewall of said outer tank for flowing an inert gas onto and drying said at least one of said sidewalls of said inner tank; and an alcohol vapor dispensing means for dispensing an alcohol vapor onto said at least one wafer.

13. An apparatus for drying wafers after wet bench in an alcohol vapor according to claim 12 further comprising elevator means for lowering/raising said wafer holder into/out of said volume of deionized water.

14. An apparatus for drying wafers after wet bench in an alcohol vapor according to claim 12, wherein said at least one inert gas inlet through a sidewall of said outer tank comprises four inert gas inlets each for drying one sidewall of said inner tank.

15. An apparatus for drying wafers after wet bench in an alcohol vapor according to claim 12, wherein said alcohol vapor dispensing means being an isopropyl alcohol vapor dispensing means.

* * * * *